(12) United States Patent
Moon

(10) Patent No.: US 9,431,629 B2
(45) Date of Patent: Aug. 30, 2016

(54) ORGANIC LIGHT-EMITTING DISPLAY APPARATUS

(71) Applicant: Samsung Display Co., Ltd., Yongin, Gyeonggi-Do (KR)

(72) Inventor: Seung-Jun Moon, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/242,686

(22) Filed: Apr. 1, 2014

(65) Prior Publication Data
US 2015/0048319 A1     Feb. 19, 2015

(30) Foreign Application Priority Data
Aug. 19, 2013   (KR) .................. 10-2013-0098143

(51) Int. Cl.
*H01L 51/52*   (2006.01)
*H01L 51/00*   (2006.01)

(52) U.S. Cl.
CPC ....... *H01L 51/5253* (2013.01); *H01L 51/0097* (2013.01); *H01L 51/52* (2013.01); *H01L 51/5256* (2013.01); *Y02E 10/549* (2013.01)

(58) Field of Classification Search
CPC .............. H01L 2924/0002; H01L 51/5237; H01L 2924/00; H01L 2251/5338; H01L 21/265; H01L 21/26513; H01L 21/28194; H01L 21/28202; H01L 21/3143; H01L 21/31604; H01L 21/67069; H01L 2251/5361; H01L 22/34
USPC ............. 257/E21.274, E21.334, E29.106, 257/E29.151, E29.246, E29.255, E31.12, 257/100, 192, 194, 40, 607; 438/285, 513, 438/514, 706, 710, 99
See application file for complete search history.

(56) References Cited

U.S. PATENT DOCUMENTS

| | | | | |
|---|---|---|---|---|
| 5,987,196 A * | 11/1999 | Noble | ............... | G02B 6/12004 257/E27.128 |
| 7,102,703 B1 * | 9/2006 | Mathew | ............ | G02F 1/133308 349/150 |
| 7,936,121 B2 * | 5/2011 | Kim | ................ | G06F 3/0412 257/100 |
| 8,530,928 B2 * | 9/2013 | Heuser | ................ | H01L 51/5237 257/100 |
| 8,778,713 B2 * | 7/2014 | Kim | .......................... | B32B 3/04 438/34 |
| 8,860,298 B2 * | 10/2014 | Wang | ..................... | H05B 33/04 313/504 |
| 2003/0143423 A1 * | 7/2003 | McCormick | ........ | H01L 51/5237 428/690 |
| 2004/0119403 A1 * | 6/2004 | McCormick | ........ | H01L 27/3211 313/506 |
| 2004/0169174 A1 * | 9/2004 | Huh | ..................... | H01L 51/5237 257/40 |
| 2004/0195967 A1 * | 10/2004 | Padiyath | ................. | B32B 27/08 313/512 |
| 2007/0105473 A1 * | 5/2007 | Lee | ..................... | H01L 51/5237 445/25 |
| 2007/0252526 A1 * | 11/2007 | Aitken | .................... | C03C 3/247 313/512 |
| 2008/0149924 A1 * | 6/2008 | Aitken | ..................... | C03C 3/12 257/40 |
| 2008/0169758 A1 * | 7/2008 | Cok | .................... | H01L 51/5237 313/506 |

(Continued)

FOREIGN PATENT DOCUMENTS

KR   1020090047217 A   5/2009
KR   1020090106050 A   10/2009
(Continued)

*Primary Examiner* — William F Kraig
*Assistant Examiner* — Edward Chin
(74) *Attorney, Agent, or Firm* — Innovation Counsel LLP

(57) ABSTRACT

Provided is an organic light-emitting display apparatus including: a substrate having one or more side walls; a display unit positioned on the substrate; and an encapsulation layer deposited over the display unit and contacting each of the one or more side walls, wherein a height of an outer end portion of the encapsulation layer is less than that of each of the side walls.

16 Claims, 3 Drawing Sheets

(56) References Cited

U.S. PATENT DOCUMENTS

| | | | |
|---|---|---|---|
| 2008/0180923 A1* | 7/2008 | Grespan | H01L 23/04 361/748 |
| 2011/0135857 A1* | 6/2011 | Logunov | C03C 8/08 428/34.6 |
| 2012/0056523 A1 | 3/2012 | Han et al. | |
| 2014/0098005 A1* | 4/2014 | Kim | G06F 3/1446 345/1.3 |

FOREIGN PATENT DOCUMENTS

| KR | 1020110066787 A | 6/2011 |
|---|---|---|
| KR | 10-2012-0023898 | 3/2012 |

* cited by examiner

ORGANIC LIGHT-EMITTING DISPLAY APPARATUS

RELATED APPLICATIONS

This application claims the benefit of Korean Patent Application No. 10-2013-0098143, filed on Aug. 19, 2013, in the Korean Intellectual Property Office, the disclosure of which is incorporated herein in its entirety by reference.

BACKGROUND

1. Field

One or more embodiments of the present invention relate generally to flat panel displays. More specifically, one or more embodiments of the present invention relate to an organic light-emitting display apparatus.

2. Description of the Related Art

An organic light-emitting display apparatus is a self-emission type display apparatus including an organic light-emitting device. This light-emitting device typically includes a hole injection electrode, an electron injection electrode, and an organic emission layer formed therebetween. The emission layer emits light when excitons drop from an excited state to a ground state, the excitons being generated when holes injected from the hole injection electrode and electrons injected from the electron injection electrode are bonded in the organic emission layer.

Because a self-emission type organic light-emitting display apparatus does not need a separate light source, the organic light-emitting display apparatus may be driven at a low voltage. It may also be formed to be lightweight and thin, and has thus attracted attention as a potential next-generation display apparatus due to these desirable characteristics, as well as others such as wide viewing angle, high contrast, quick response speeds, and the like. However, organic light-emitting devices are also currently vulnerable to deterioration due to external moisture, oxygen, and/or the like. Accordingly, organic light-emitting devices are typically sealed to protect the organic light-emitting device from contaminants such as external moisture, oxygen, and/or the like.

Recently, to make the organic light-emitting display apparatus thin and/or flexible, a thin film encapsulation (TFE) layer which includes an organic layer and an inorganic layer has been used as a means for sealing the organic light-emitting device.

SUMMARY

One or more embodiments of the present invention include an organic light-emitting display apparatus having improved side-surface barrier characteristics.

Additional aspects will be set forth in part in the description which follows and, in part, will be apparent from the description, or may be learned by practice of the presented embodiments.

According to one or more embodiments of the present invention, an organic light-emitting display apparatus includes: a substrate having one or more side walls; a display unit positioned on the substrate; and an encapsulation layer deposited over the display unit and contacting each of the one or more side walls, wherein a height of an outer end portion of the encapsulation layer is less than that of each of the side walls.

A height of a central region of the encapsulation layer may be greater than that of each of the side walls.

The organic light-emitting display apparatus may further include a barrier part formed on the encapsulation layer and disposed in a space at least partially defined by the encapsulation layer and one or more of the side walls.

A sum of the height of the outer end portion of the encapsulation layer and a height of the barrier part may be less than that of each of the side walls.

The encapsulation layer may include a first inorganic layer, a first organic layer formed on the first inorganic layer, and a second inorganic layer which covers the first organic layer.

The organic light-emitting display apparatus may further include a barrier part formed on the second inorganic layer and disposed in a space at least partially defined by the second inorganic layer and one or more of the side walls.

The barrier part may be formed of a same material as that of the second inorganic layer.

Each of the one or more side walls may include a groove formed therein.

The encapsulation layer may include a first inorganic layer, a first organic layer formed on the first inorganic layer, and a second inorganic layer which covers the first organic layer.

The first inorganic layer and the second inorganic layer may each extend into each groove.

The organic light-emitting display apparatus may further include a barrier part formed on the second inorganic layer and in a space at least partially defined by the second inorganic layer and one or more of the side walls.

The barrier part may be formed of a same material as that of the second inorganic layer.

According to one or more embodiments of the present invention, an organic light-emitting display apparatus includes: a substrate having one or more side walls; a display unit positioned on the substrate; and an encapsulation layer deposited over the display unit and contacting each of the one or more side walls, wherein each of the side walls includes a plurality of at least approximately planar portions arranged in stepwise manner, and a height of an outer end portion of the encapsulation layer is less than that of each of the side walls.

The organic light-emitting display apparatus may further include a barrier part formed on the encapsulation layer.

A sum of the height of the outer end portion of the encapsulation layer and a height of the barrier part may be less than that of each of the side walls.

The encapsulation layer may include a first inorganic layer, a first organic layer formed on the first inorganic layer, and a second inorganic layer which covers the first organic layer.

The organic light-emitting display apparatus may further include a barrier part formed on the second inorganic layer and spaced apart from the first organic layer.

The first inorganic layer and the second inorganic layer may be formed on one or more of the at least approximately planar portions.

The organic light-emitting display apparatus may further include a barrier part formed on the second inorganic layer and spaced apart from the first organic layer.

The barrier part may be formed of a same material as that of the second inorganic layer.

BRIEF DESCRIPTION OF THE DRAWINGS

These and/or other aspects will become apparent and more readily appreciated from the following description of the embodiments, taken in conjunction with the accompanying drawings in which.

Figure 1:
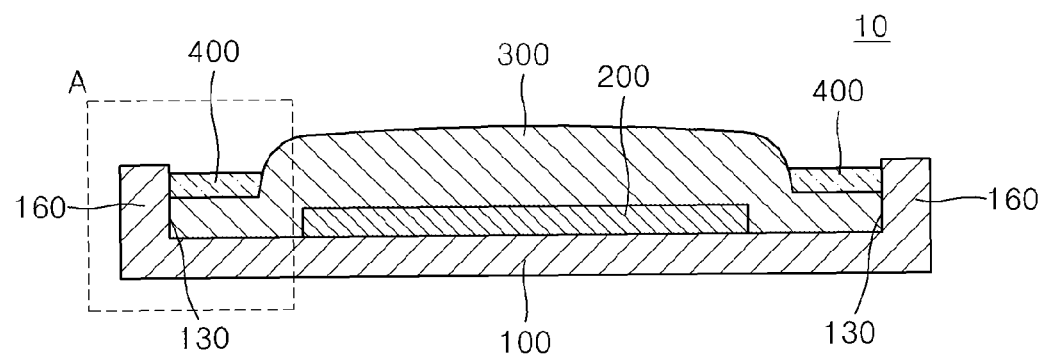
FIG. 1 is a schematic cross-sectional view of an organic light-emitting display apparatus according to an embodiment of the present invention.

The various Figures are not necessarily to scale.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Figure 2:
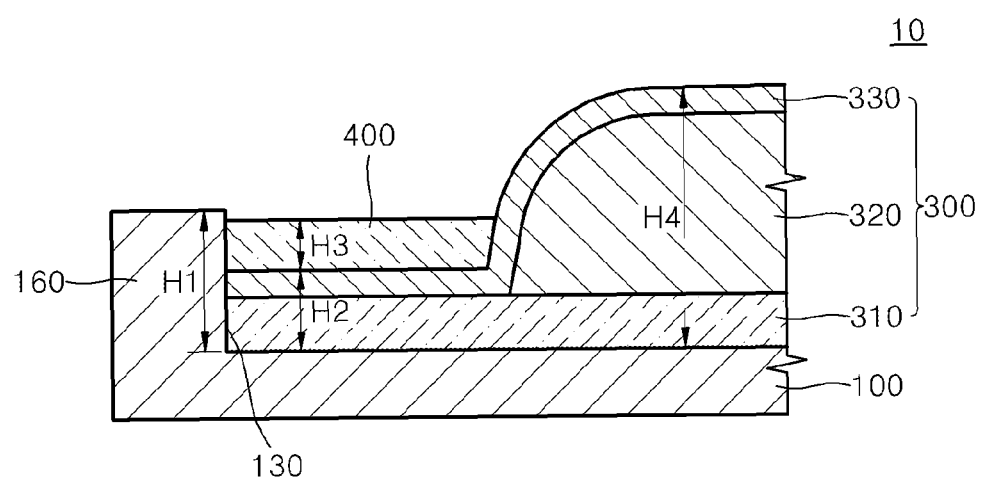
FIG. 2 is a magnified cross-sectional view of a portion A of FIG. 1.
Figure 3:
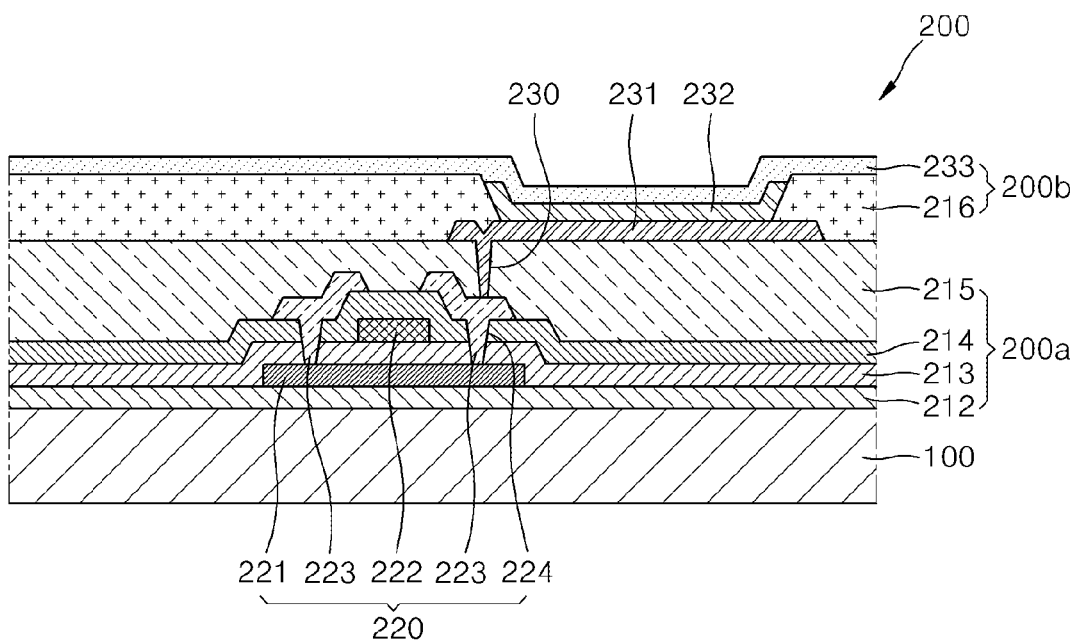
FIG. 3 is a magnified cross-sectional view of a display unit of the organic light-emitting display apparatus of FIG. 1.

FIG. 1 is a schematic cross-sectional view of an organic light-emitting display apparatus 10 according to an embodiment of the present invention, FIG. 2 is a magnified cross-sectional view of a portion A of FIG. 1, and FIG. 3 is a magnified cross-sectional view of a display unit 200 of the organic light-emitting display apparatus 10 of FIG. 1.

Referring to FIGS. 1 to 3, the organic light-emitting display apparatus 10 may include a substrate 100, the display unit 200 formed on the substrate 100, an encapsulation layer 300 which seals up the display unit 200, and a barrier part 400 formed on the encapsulation layer 300.

The substrate 100 may be a flexible substrate and may be formed of a plastic having good heat resistance and durability, such as polyimide, polyethylene terephthalate (PET), polycarbonate, polyethylene naphthalate, polyarylate (PAR), polyetherimide, or the like. However, one or more embodiments of the present invention are not limited thereto, and the substrate 100 may be formed of various materials, such as a metal, glass, and the like.

A groove 130 may be formed on one surface of the substrate 100. Accordingly, side walls 160 may be formed in the substrate 100.

The display unit 200 may include an organic thin-film transistor (TFT) layer 200a and a pixel part 200b. The pixel part 200b may be an organic light-emitting device (OLED). The display unit 200 will now be described in more detail with reference to FIG. 3.

A buffer layer 212 may be formed on the substrate 100. The buffer layer 212 functions to prevent the intrusion of impurity elements through the substrate 100 and to provide a planarized surface on the substrate 101, and may be formed of various materials for this function.

For example, the buffer layer 212 may include an inorganic material, such as a silicon oxide, a silicon nitride, a silicon oxynitride, an aluminum oxide, an aluminum nitride, a titanium oxide, a titanium nitride, or the like, or an organic material, such as polyimide, polyesther, acryl, or the like. The buffer layer 212 may also be formed as a stacked body of a plurality of layers of different materials from among the materials described above.

The TFT layer 200a may be formed on the buffer layer 212. Although a top-gate TFT is illustrated as shown in the current embodiment as one example of the TFT layer 200a, a TFT having a different structure may instead be employed.

The TFT layer 200a may include an active layer 221, a gate electrode 222, and source and drain electrodes 223.

The active layer 221 is formed of a semiconductor material, and a gate insulating layer 213 is formed to cover the active layer 221. The active layer 221 may be formed of an inorganic semiconductor such as amorphous silicon or polysilicon, or alternatively may be formed of an organic semiconductor. The active layer 221 includes a source region, a drain region, and a channel region therebetween. The gate insulating layer 213 insulates the active layer 221 from the gate electrode 222 and may be formed of an organic material or an inorganic material, such as a silicon nitride ($SiN_x$) or a silicon oxide ($SiO_x$).

The gate electrode 222 is provided on the gate insulating layer 213, and an interlayer insulating layer 214 is formed to cover the gate electrode 222 and the gate insulating layer 213.

The gate electrode 222 may include gold (Au), silver (Ag), copper (Cu), nickel (Ni), platinum (Pt), palladium (Pd), aluminum (Al), molybdenum (Mo), or an alloy, such as an Al:neodymium (Nd) alloy, a Mo:tungsten (W) alloy, or the like. However, the gate electrode 222 is not limited thereto and may be formed of various materials according to various design conditions that may be considered.

The interlayer insulating layer 214 is disposed between the gate electrode 222 and the source and drain electrodes 223 for insulation therebetween, and may be formed of an inorganic material such as $SiN_X$ or $SiO_x$.

The source and drain electrodes 223 are formed on the interlayer insulating layer 214. In detail, holes in the interlayer insulating layer 214 and the gate insulating layer 213 are formed to expose the source region and the drain region of the active layer 221, and the source and drain electrodes 223 are formed therein so as to contact the exposed source and drain regions of the active layer 221.

Although FIG. 3 illustrates a top gate type TFT which sequentially includes the active layer 221, the gate electrode 222, and the source and drain electrodes 223, one or more embodiments of the present invention are not limited thereto, and the gate electrode 222 may instead be disposed below the active layer 221.

The TFT layer 200a is electrically connected to the pixel part 200b to drive the pixel part 200b, and is protected by a planarization layer 215 that covers the TFT layer 200a.

The planarization layer 215 may include an inorganic insulating layer and/or an organic insulating layer. This inorganic insulating layer may be made of materials such as a silicon oxide ($SiO_2$), a silicon nitride ($SiN_x$), a silicon oxynitride (SiON), an aluminum oxide ($Al_2O_3$), a titanium oxide ($TiO_2$), a tantalum oxide ($Ta_2O_5$), a hafnium oxide ($HfO_2$), a zirconium oxide ($ZrO_2$), a barium stannate titanate (BST), a lead zirconate titanate (PZT), or the like. The organic insulating layer may be made of materials such as a typical general-use polymer (polymethylmethacrylate (PMMA) or polystyrene (PS)), a polymer derivative having a phenol group, an acryl group polymer, an imide group polymer, an aryl ether group polymer, an amide group polymer, a fluorine group polymer, a p-xylene group polymer, a vinyl alcohol group polymer, a blend thereof, or the like. The planarization layer 215 may be formed as a complex stacked body with one or more inorganic insulating layers and one or more organic insulating layers.

The pixel part 200b is formed on the planarization layer 215 and may include a pixel electrode 231, an intermediate layer 232, and an opposite electrode 233.

The pixel electrode 231 is formed on the planarization layer 215 and is electrically connected to the source or drain electrodes 223 through a contact hole formed in the planarization layer 215.

The pixel electrode 231 may be a reflective electrode and may include a reflective layer formed of Ag, Mg, Al, Pt, Pd, Au, Ni, Nd, iridium (Ir), chromium (Cr), a compound thereof, or the like, and a transparent or translucent electrode layer formed on the reflective layer. The transparent or translucent electrode layer may include at least one selected from the group consisting of an indium tin oxide (ITO), an indium zinc oxide (IZO), a zinc oxide (ZnO), an indium oxide ($In_2O_3$), an indium gallium oxide (IGO), and an aluminum zinc oxide (AZO).

The opposite electrode 233 disposed to face the pixel electrode 231 may be a transparent or translucent electrode and may be formed of a metal thin film having a small work function, where the thin film includes lithium (Li), calcium (Ca), lithium fluoride (LiF)/Ca, LiF/Al, Al, Ag, magnesium (Mg), or a compound thereof. In addition, an auxiliary electrode layer or a bus electrode may be further formed of a material for forming a transparent electrode, such as ITO, IZO, ZnO, $In_2O_3$, or the like.

Thus, the opposite electrode 233 may pass light emitted by an organic emission layer included in the intermediate layer 232. In particular, the light emitted by the organic emission layer may be directly emitted towards (and thus through) the opposite electrode 233, or may be reflected by the pixel electrode 231 (which can include a reflective electrode) back up toward the opposite electrode 233.

However, the organic light-emitting display apparatus 10 according to the current embodiment is not limited to a top emission type display configuration. For example, light emitted by the organic emission layer may instead be emitted toward the substrate 100 as a bottom emission type display. In this case, the pixel electrode 231 may include a transparent or translucent electrode, and the opposite electrode 233 may include a reflective electrode. The organic light-emitting display apparatus 10 may also be a double-side emission type to emit light in both directions, i.e., to the top and the bottom.

A pixel defining layer 216 is formed on the pixel electrode 231 and formed of an insulating material. The pixel defining layer 216 exposes a predetermined region of the pixel electrode 231, and the intermediate layer 232 (including the organic emission layer) is located in the exposed region.

The organic emission layer may be formed of a low-molecular organic material or a high-molecular organic material, and besides the organic emission layer, the intermediate layer 232 may further selectively include function layers, such as a hole transport layer (HTL), a hole injection layer (HIL), an electron transport layer (ETL), an electron injection layer (EIL), and the like.

Referring back to FIGS. 1 and 2, the encapsulation layer 300 seals the display unit 200 and prevents deterioration of the display unit 200.

The encapsulation layer 300 may include a first inorganic layer 310, a first organic layer 320 formed on the first inorganic layer 310, and a second inorganic layer 330 which covers the first organic layer 320.

The first inorganic layer 310 may be formed, for example, to cover the display unit 200 and may be formed of an inorganic material having relatively high moisture resistance, such as $SiN_x$, $Al_2O_3$, $SiO_x$, or $TiO_2$, to block the intrusion of ambient moisture or oxygen into the display unit 200. The first inorganic layer 310 may be formed on the entire surface of the groove 130.

The first organic layer 320 may be formed on the first inorganic layer 310. The first organic layer 320 may be formed of a flexible organic material to alleviate internal stress in the first inorganic layer 310 or further prevent the intrusion of external moisture or oxygen by filling fine cracks and pinholes in the first inorganic layer 310. An area of the first organic layer 320 may be smaller than that of the first inorganic layer 310. That is, the first organic layer 320 may not cover the entire upper surface of the first inorganic layer 310.

The second inorganic layer 330 may be formed to cover the first organic layer 320. The second inorganic layer 330 may be formed of an inorganic material having desirable moisture-resistant characteristics, such as $SiN_x$, $Al_2O_3$, $SiO_x$, or $TiO_2$, to block the intrusion of moisture or oxygen from the outside. The end part of the encapsulation layer 300 includes only the first inorganic layer 310 and the second inorganic layer 330, as each of those layers extends beyond the edge of the first organic layer 320. Thus, a height H2 of the end part of the encapsulation layer 300 may be a sum of a height of the first inorganic layer 310 and a height of the second inorganic layer 330.

The height H2 of the end part of the encapsulation layer 300 may be formed to be less than a height H1 of the side wall 160. Accordingly, the side wall 160 may effectively help to prevent the intrusion of external moisture or gas. A height H4 of a central region of the encapsulation layer 300 may be greater than the height H1 of the side wall 160.

The barrier part 400 may be formed on the encapsulation layer 300. The barrier part 400 may be disposed inside a space partially formed by the groove 130. The barrier part 400 may be disposed outside the first organic layer 320. The barrier part 400 may be formed of an inorganic material having high moisture resistance, such as $SiN_x$, $Al_2O_3$, $SiO_x$, or $TiO_2$, to block the intrusion of moisture or oxygen from the outside. The forming of the barrier part 400 may effectively prevent the intrusion of external moisture or gases. In addition, when the barrier part 400 fills a space between the encapsulation layer 300 and the side wall 160, the space between the encapsulation layer 300 and the side wall 160 may be substantially planarized, or at least made more planar. Accordingly, the accumulation of foreign substances in the space between the encapsulation layer 300 and the side wall 160 may be prevented. The barrier part 400 may be formed of the same material as the second inorganic layer 330 (although this need not necessarily be the case). Accordingly, an adhesive force between the barrier part 400 and the second inorganic layer 330 may be strengthened, thereby more stably disposing the barrier part 400 on the second inorganic layer 330.

A sum of the height H2 of the end part of the encapsulation layer 300 and a height H3 of the barrier part 400 may be less than the height H1 of the side wall 160. Accordingly, the side wall 160 may effectively prevent the intrusion of external moisture or gas into the sides of the encapsulation layer 300 and barrier part 400.

Although FIG. 1 illustrates that the encapsulation layer 300 includes the first inorganic layer 310, the first organic layer 320, and the second inorganic layer 330, one or more embodiments of the present invention are not limited thereto, and the encapsulation layer 300 may be formed by alternately stacking a plurality of organic layers and a plurality of inorganic layers, or an organic layer may be formed as the lowermost layer, contacting the display unit 200.

Figure 4:
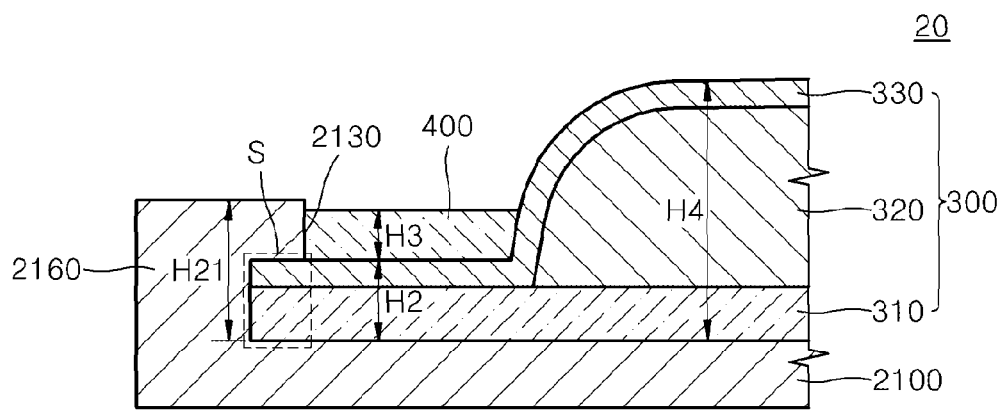
FIG. 4 is a schematic cross-sectional view of a portion of an organic light-emitting display apparatus according to another embodiment of the present invention.

FIG. 4 is a schematic cross-sectional view of a portion of an organic light-emitting display apparatus 20 according to another embodiment of the present invention.

Differences between the current embodiment and the above-described embodiment of FIG. 2 will be mainly described. Herein, like reference numerals in the drawings denote like members having the same functions.

Referring to FIG. 4, the organic light-emitting display apparatus 20 may include a substrate 2100, the display unit 200 formed on the substrate 2100, the encapsulation layer 300 which seals the display unit 200, and the barrier part 400 formed on the encapsulation layer 300. Since the display unit 200 is the same as that described with respect to FIGS. 1 and 3, a repeated description thereof is omitted.

A groove 2130 may be formed on one surface of the substrate 2100. Accordingly, a side wall 2160 may be formed in the substrate 2100. The groove 2130 may at least partially define a recess or space S formed at an inner part of the side wall 2160. The side wall 2160 may be formed by scooping out or otherwise removing material from the side wall 2160. The space S may be filled by the encapsulation layer 300. Accordingly, since the side wall 2160 may be shaped so as to surround the outer edge of the encapsulation layer 300, the side wall 2160 may more effectively prevent the intrusion of external moisture or gas into the sides of the encapsulation layer 300.

The height H2 of the end part, or edge, of the encapsulation layer 300 may be lower than a height H21 of the side wall 2160. Accordingly, the side wall 2160 may effectively prevent the intrusion of external moisture or gas through the edge of encapsulation layer 300. The height H2 of the end part of the encapsulation layer 300 may be the same as a height of the space S. The height H4 of the central region of the encapsulation layer 300 may be greater than the height H21 of the side wall 2160.

The barrier part 400 may be formed on the encapsulation layer 300. The barrier part 400 may be disposed inside a space formed by edges of the groove 2130 and central region of encapsulation layer 300. The forming of the barrier part 400 may effectively prevent the intrusion of external moisture or gas into portions of encapsulation layer 300. In addition, when the barrier part 400 fills a space between the encapsulation layer 300 and the side wall 2160, the space between the encapsulation layer 300 and the side wall 2160 may be substantially planarized, or made more planar. Accordingly, the accumulation of foreign substances in the space between the encapsulation layer 300 and the side wall 2160 may be prevented or reduced. The barrier part 400 may be formed of the same material as the second inorganic layer 330. Accordingly, an adhesive force between the barrier part 400 and the second inorganic layer 330 may be strengthened, thereby more stably disposing the barrier part 400 on the second inorganic layer 330. The barrier part 400 may be disposed outside (i.e. radially outward from, or otherwise separated from) the first organic layer 320.

The sum of the height H2 of the end part of the encapsulation layer 300 and the height H3 of the barrier part 400 may be less than the height H21 of the side wall 2160. Accordingly, the side wall 2160 may effectively prevent the intrusion of external moisture or gas into sides of the encapsulation layer 300 and barrier part 400.

The encapsulation layer 300 may include the first inorganic layer 310, the first organic layer 320 formed on the first inorganic layer 310, and the second inorganic layer 330 which covers the first organic layer 320. According to the forming of the second inorganic layer 330 which covers the first organic layer 320, the end part of the encapsulation layer 300 may include only the first inorganic layer 310 and the second inorganic layer 330. Thus, the space S may be filled by the first inorganic layer 310 and the second inorganic layer 330, but not the first organic layer 320. Thus, the height H2 of the end part of the encapsulation layer 300 may be a sum of the height of the first inorganic layer 310 and the height of the second inorganic layer 330.

Figure 5:
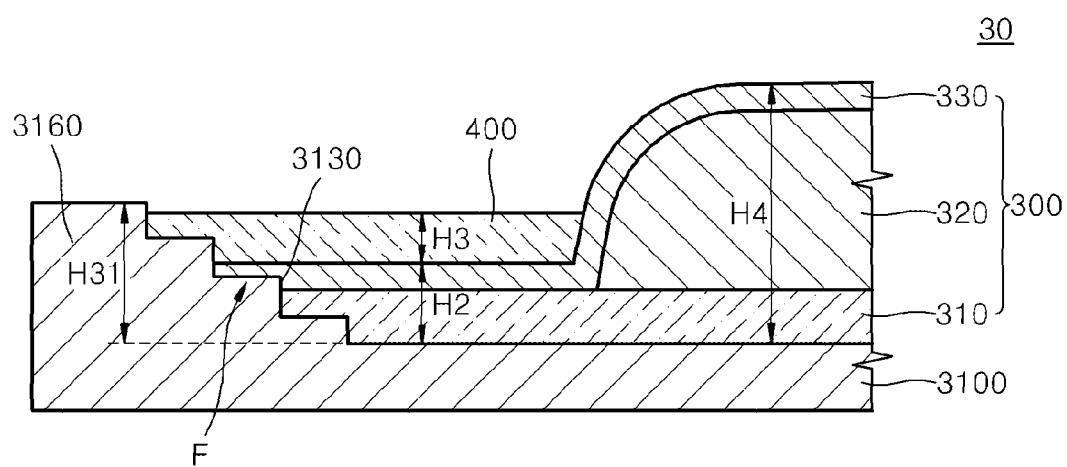
FIG. 5 is a schematic cross-sectional view of a portion of an organic light-emitting display apparatus according to another embodiment of the present invention.

FIG. 5 is a schematic cross-sectional view of a portion of an organic light-emitting display apparatus 30 according to another embodiment of the present invention.

Differences between the current embodiment and the above-described embodiment of FIG. 2 will be mainly described. Herein, like reference numerals in the drawings denote like members having the same functions.

Referring to FIG. 5, the organic light-emitting display apparatus 30 may include a substrate 3100, the display unit 200 formed on the substrate 3100, the encapsulation layer 300 which seals the display unit 200, and the barrier part 400 formed on the encapsulation layer 300. Since the display unit 200 is the same as that described with respect to FIGS. 1 and 3, a repeated description thereof is omitted.

A groove 3130 may be formed on one surface of the substrate 3100. Accordingly, a side wall 3160 may be formed in the substrate 3100. The side wall 3160 may include an inclined part F which has a staircase shape when viewed in cross-section, with planar or approximately planar portions arranged in stepwise manner in order of increasing elevation from right to left in the view of FIG. 5 (i.e. increasing elevation from the inner portion of inclined part F to its outer portion). The side wall 3160 may effectively prevent the intrusion of external moisture or gas.

The height H2 of the end part of the encapsulation layer 300 may be less than a height H31 of the side wall 3160. Accordingly, the side wall 3160 may effectively prevent the intrusion of external moisture or gas through the sides of encapsulation layer 300. The height H4 of the central region of the encapsulation layer 300 may be greater than the height H31 of the side wall 3160.

The barrier part 400 may be formed on the encapsulation layer 300 and the inclined part F. The barrier part 400 may be disposed inside a space between the groove 3130 and second inorganic layer 330. The forming of the barrier part 400 may effectively prevent the intrusion of external moisture or gas. In addition, when the barrier part 400 fills a space between the encapsulation layer 300 and the side wall 3160, the space between the encapsulation layer 300 and the side wall 3160 may be more closely planarized. Accordingly, the accumulation of foreign substances in the space between the encapsulation layer 300 and the side wall 3160 may be prevented or reduced. The barrier part 400 may be formed of the same material as the second inorganic layer 330. Accordingly, an adhesive force between the barrier part 400 and the second inorganic layer 330 may be strengthened, thereby more stably disposing the barrier part 400 on the second inorganic layer 330. The barrier part 400 may be disposed outside (i.e. radially outward from, or otherwise separated from) the first organic layer 320.

The sum of the height H2 of the end part of the encapsulation layer 300 and the height H3 of the barrier part 400 may be less than the height H31 of the side wall 3160.

Accordingly, the side wall 3160 may effectively prevent the intrusion of external moisture or gas through the sides of encapsulation layer 300.

The encapsulation layer 300 may include the first inorganic layer 310, the first organic layer 320 formed on the first inorganic layer 310, and the second inorganic layer 330 which covers the first organic layer 320. According to the forming of the second inorganic layer 330 which covers the first organic layer 320, the end part of the encapsulation layer 300 may include only the first inorganic layer 310 and the second inorganic layer 330, and not the first organic layer 320. The height H2 of the end part of the encapsulation layer 300 may therefore be a sum of the height of the first inorganic layer 310 and the height of the second inorganic layer 330.

The first inorganic layer 310, the second inorganic layer 330, and the barrier part 400 may be formed on the inclined part F. Accordingly, a contact area of the first inorganic layer 310, the second inorganic layer 330, and the barrier part 400 with the substrate 3100 may increase relative to the case in which the groove 3130 has a non-inclined, vertical face contacting the layers 300, 400. Accordingly, an adhesive force between the first inorganic layer 310, the second inorganic layer 330, and the barrier part 400 to the substrate 3100 may be improved, thereby more stably disposing the first inorganic layer 310, the second inorganic layer 330, and the barrier part 400 on the substrate 3100.

As described above, according to various embodiments of the present invention, a side-surface barrier characteristic of an organic light-emitting display apparatus may be improved.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims. For example, elements and features from different embodiments may be mixed and matched as desired, to form further embodiments contemplated by the invention.

What is claimed is:

1. An organic light-emitting display apparatus comprising:
    a substrate including a recess and a side wall surrounding the recess, the side wall extending in unitary and continuous manner from the substrate;
    a display unit positioned in the recess of the substrate; and
    an encapsulation layer deposited over the display unit and contacting the side wall,
    wherein a height of an outer end portion of the encapsulation layer is less than that of the side wall, the recess has a depth greater than a thickness of the outer end portion of the encapsulation layer, and a height of a central region of the encapsulation layer is greater than that of the side wall; and
    wherein a barrier part is disposed between the side wall and the central region of the encapsulation layer.

2. The organic light-emitting display apparatus of claim 1, wherein a sum of the height of the outer end portion of the encapsulation layer and a height of the barrier part is less than that of the side wall.

3. The organic light-emitting display apparatus of claim 1, wherein the encapsulation layer comprises a first inorganic layer, a first organic layer disposed on the first inorganic layer, and a second inorganic layer which covers the first organic layer.

4. The organic light-emitting display apparatus of claim 3, wherein the barrier part is formed on the second inorganic layer and disposed in a space at least partially defined by the second inorganic layer and the side wall.

5. The organic light-emitting display apparatus of claim 4, wherein the barrier part is formed of a same material as that of the second inorganic layer.

6. The organic light-emitting display apparatus of claim 1, wherein the side wall includes an inner surface facing the recess, and the encapsulation layer contacts the inner surface of the side wall.

7. The organic light-emitting display apparatus of claim 3, wherein end portions of the first and second inorganic layers contact each other.

8. An organic light-emitting display apparatus comprising:
    a substrate including a recess and a side wall surrounding the recess, the side wall extending in unitary and continuous manner from the substrate;
    a display unit positioned in the recess of the substrate; and
    an encapsulation layer deposited over the display unit and contacting the side wall,
    wherein the side wall includes a plurality of at least approximately planar portions arranged in stepwise manner, the recess has a depth greater than a thickness of the outer end portion of the encapsulation layer, and a height of an outer end portion of the encapsulation layer is less than that of the side wall; and
    wherein a barrier part is disposed between the side wall and the central region of the encapsulation layer.

9. The organic light-emitting display apparatus of claim 8, wherein a sum of the height of the outer end portion of the encapsulation layer and a height of the barrier part is less than that of the side wall.

10. The organic light-emitting display apparatus of claim 8, wherein the encapsulation layer comprises a first inorganic layer, a first organic layer disposed on the first inorganic layer, and a second inorganic layer which covers the first organic layer.

11. The organic light-emitting display apparatus of claim 10, wherein the barrier part is disposed on the second inorganic layer and spaced apart from the first organic layer.

12. The organic light-emitting display apparatus of claim 10, wherein the first inorganic layer and the second inorganic layer are disposed on one or more of the at least approximately planar portions.

13. The organic light-emitting display apparatus of claim 12, wherein the barrier part is disposed on the second inorganic layer and spaced apart from the first organic layer.

14. The organic light-emitting display apparatus of claim 13, wherein the barrier part is disposed of a same material as that of the second inorganic layer.

15. The organic light-emitting display apparatus of claim 8, wherein the side wall includes an inner surface facing the recess, and the encapsulation layer contacts the inner surface of the side wall.

16. The organic light-emitting display apparatus of claim 10, wherein end portions of the first and second inorganic layers contact each other.

* * * * *